United States Patent
Saenger et al.

(10) Patent No.: US 9,411,245 B2
(45) Date of Patent: Aug. 9, 2016

(54) POLARIZATION-INFLUENCING OPTICAL ARRANGEMENT, IN PARTICULAR IN A MICROLITHOGRAPHIC PROJECTION EXPOSURE APPARATUS

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/297,273

(22) PCT Filed: Jan. 11, 2013

(86) PCT No.: PCT/EP2013/050462
§ 371 (c)(1),
(2) Date: Jun. 6, 2014

(87) PCT Pub. No.: WO2013/104744
PCT Pub. Date: Jul. 18, 2013

(65) Prior Publication Data
US 2014/0313498 A1  Oct. 23, 2014

(30) Foreign Application Priority Data
Jan. 12, 2012 (DE) .......................... 10 2012 200 368

(51) Int. Cl.
*G03B 27/72* (2006.01)
*G03B 27/54* (2006.01)
(Continued)

(52) U.S. Cl.
CPC ............ *G03F 7/7015* (2013.01); *G02B 5/3083* (2013.01); *G02B 27/281* (2013.01);
(Continued)

(58) Field of Classification Search
CPC ............ G03F 7/70566; G03F 7/70966; G03F 7/70308
USPC .................................................. 355/53, 67, 71
See application file for complete search history.

(56) References Cited

U.S. PATENT DOCUMENTS

| 5,744,721 A | 4/1998 | Varnum |
| 5,886,810 A | 3/1999 | Siahpoushan et al. |

(Continued)

FOREIGN PATENT DOCUMENTS

| DE | 101 24 566 | 11/2002 |
| DE | 10 2007 027 985 A1 | 6/2008 |

(Continued)

OTHER PUBLICATIONS

German Office Action with translation thereof, for corresponding DE Appln. No. 10 2012 200 368.1, dated Sep. 19, 2012.
(Continued)

*Primary Examiner* — Hung Henry Nguyen
(74) *Attorney, Agent, or Firm* — Fish & Richardson P.C.

(57) ABSTRACT

The disclosure provides a polarization-influencing optical arrangement that includes a first retardation element and a second retardation element. The optical arrangement is configurable so that a polarization-influencing effect of the first retardation element corresponds to an effect of a first lambda/2 plate having a first fast axis of the birefringence and a polarization-influencing effect of the second retardation element corresponds to an effect of a second lambda/2 plate having a second fast axis of the birefringence. An angle between the first fast axis and the second fast axis is 45°±5°.

22 Claims, 9 Drawing Sheets

(51) Int. Cl.
  *G03F 7/20* (2006.01)
  *G02B 27/28* (2006.01)
  *G02B 5/30* (2006.01)
(52) U.S. Cl.
  CPC ........ *G03F 7/70275* (2013.01); *G03F 7/70308* (2013.01); *G03F 7/70566* (2013.01); *G03F 7/70891* (2013.01); *G03F 7/70966* (2013.01)

(56) References Cited

U.S. PATENT DOCUMENTS

| | | | |
|---|---|---|---|
| 6,392,800 B2 | 5/2002 | Schuster | |
| 8,023,104 B2 * | 9/2011 | Schuster | ............... 355/53 |
| 8,031,327 B2 | 10/2011 | Fiolka | |
| 2003/0011893 A1 | 1/2003 | Shiraishi et al. | |
| 2004/0240073 A1 | 12/2004 | Gerhard | |
| 2005/0094268 A1 | 5/2005 | Fiolka et al. | |
| 2005/0122594 A1 | 6/2005 | Krahmer et al. | |
| 2005/0243222 A1 * | 11/2005 | Maul et al. | ............... 349/5 |
| 2007/0146676 A1 | 6/2007 | Tanitsu et al. | |
| 2007/0296941 A1 * | 12/2007 | Omura | ............... 355/67 |
| 2008/0174759 A1 | 7/2008 | Schuster | |
| 2009/0027646 A1 * | 1/2009 | Fiolka et al. | ............... 355/67 |
| 2009/0115989 A1 | 5/2009 | Tanaka | |
| 2009/0195766 A1 | 8/2009 | Dieckmann et al. | |
| 2011/0063597 A1 | 3/2011 | Mengel | |
| 2013/0271741 A1 | 10/2013 | Saenger | |

FOREIGN PATENT DOCUMENTS

| | | |
|---|---|---|
| DE | 10 2007 059 258 | 7/2008 |
| DE | 10 2011 079 548 A1 | 7/2012 |
| EP | 1 840 945 | 10/2007 |
| JP | H05-188091 A | 7/1993 |
| JP | 2008-177581 | 7/2008 |
| JP | 2008-277815 | 11/2008 |
| JP | 2009-236839 A | 10/2009 |
| WO | WO 02/093209 A2 | 11/2002 |
| WO | 2005/031467 | 4/2005 |
| WO | 2005/069081 | 7/2005 |
| WO | 2006/040184 | 4/2006 |
| WO | 2006/077849 | 7/2006 |
| WO | WO 2009/065819 | 5/2009 |
| WO | WO 2011/154227 | 12/2011 |

OTHER PUBLICATIONS

International Preliminary Report on Patentability for corresponding PCT Appl No. PCT/EP2013/050462, dated Jul. 24, 2014.
International Search Report and Written Opinion issued on Jun. 12, 2013, in PCT application No. PCT/EP2013/050462, filed on Jan. 11, 2013, 12 pages.
Japanese Office Action with translation thereof, for corresponding JP Appln. No. 2014-551623, dated May 28, 2015.
Korean Office Action with English translation thereof for corresponding KR Appln. No. 10-2014-7021054, 18 pages, dated Oct. 19, 2015.
Japanese Office Action, with translation thereof, for corresponding JP Appl. No. 2014-551623, dated Jan. 25, 2016.
Hiroshi Nomura, "Special Topic Recent Lithography Technology—for Further Miniaturization/Polarization Measurement of Illumination Light of Semiconductor Exposure Apparatus", OPlusE, Sep. 2009, vol. 29, No. 9 (No. 334 as a whole) pp. 926-933 (with translation).
Korean Office Action, with translation thereof, for corresponding KR Appl No. 10-2014-7021054, dated May 30, 2016.

* cited by examiner

POLARIZATION-INFLUENCING OPTICAL ARRANGEMENT, IN PARTICULAR IN A MICROLITHOGRAPHIC PROJECTION EXPOSURE APPARATUS

CROSS REFERENCE TO RELATED APPLICATIONS

This application is a continuation of, and claims benefit under 35 USC 120 to, international application PCT/EP2013/050462, filed Jan. 11, 2013, which claims priority of German Patent Application 10 2012 200 368.1 filed on Jan. 12, 2012. The content of these applications is hereby incorporated by reference.

BACKGROUND OF THE INVENTION

1. Field of the Invention

The invention relates to a polarization-influencing optical arrangement, in particular in a microlithographic projection exposure apparatus.

2. Prior Art

Microlithography is used for producing microstructured components, such as, for example, integrated circuits or LCDs. The microlithography process is carried out in a so-called projection exposure apparatus comprising an illumination device and a projection lens. The image of a mask (=reticle) illuminated via the illumination device is in this case projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

Various approaches are known for setting specific polarization distributions in the pupil plane and/or in the reticle in a targeted manner in the illumination device for the purpose of optimizing the imaging contrast. In particular, it is known, both in the illumination device and in the projection lens, to set a tangential polarization distribution for high-contrast imaging. "Tangential polarization" (or "TE polarization") is understood to mean a polarization distribution for which the oscillation planes of the electric field strength vectors of the individual linearly polarized light rays are oriented approximately perpendicularly to the radius directed to the optical system axis. By contrast, "radial polarization" (or "TM polarization") is understood to mean a polarization distribution for which the oscillation planes of the electric field strength vectors of the individual linearly polarized light rays are oriented approximately radially with respect to the optical system axis.

In particular, it is known to arrange corresponding polarization-influencing elements or arrangements based on the use of linear or circular birefringence in a pupil plane of the illumination device or of the projection lens or in the vicinity thereof.

With regard to the prior art, reference is made merely by way of example to WO 2005/069081 A2, WO 2005/031467 A2, DE 101 24 566 A1 or WO 2006/077849 A1.

Depending on the concrete use situation, however, the problem can occur that the retardation provided by the polarization-influencing element of the arrangement is dependent on the propagation direction of the electromagnetic radiation in the (linearly or circularly) birefringent material and thus on the angle of incidence of the electromagnetic radiation on the polarization-influencing element or arrangement. In this connection, with regard to the prior art, reference is made by way of example to DE 10 2007 059 258 A1.

Different angles of incidence of the electromagnetic radiation can occur in particular when the relevant polarization-influencing element or arrangement is not used within the first pupil plane of the illumination device in the light propagation direction (through which the light rays still pass in a parallel fashion), but rather is positioned for example for rotating the polarization direction in a downstream plane (for example in a downstream pupil plane of the illumination device or else in a pupil plane of the projection lens) in which an angular distribution of the light rays that pass through the polarization-influencing element or arrangement is present.

A further problem that occurs using polarization-influencing elements or arrangements in a microlithographic projection exposure apparatus is that the polarization-influencing effect of the element or arrangement is generally dependent on the polarization state of the electromagnetic radiation passing through the element or arrangement, wherein different illumination settings can be set depending on the application e.g. in a first pupil plane in the light propagation direction.

The above-described situations of different propagation directions or angles and different input polarizations of the light rays passing through a polarization-influencing element can occur for example if e.g. for compensation or minimization of 3D mask effects or for targeted minimization of the retardation or sp splitting in the illumination device for instance (instead of an actually desired illumination setting with TE polarization or tangential polarization distribution) an illumination setting with TM polarization or radial polarization distribution is set and is intended to be converted into the actually desired TE polarization distribution in the further course of the beam path (e.g. downstream of the mask). Another possible scenario is the compensation of lifetime-induced birefringence effects.

Furthermore, it is also possible generally in a projection exposure apparatus that an initially present polarization state, possibly set in a targeted manner, can be influenced by polarization-influencing effects (e.g. stress birefringence induced by mount components in the material of the optical components such as e.g. lens elements, influence of dielectric layers, intrinsic birefringence in the material of optical components etc.), wherein the production of a desired output polarization distribution is additionally made more difficult by the above-mentioned polarization dependence of the effect achieved by the polarization-influencing element or arrangement.

SUMMARY OF THE INVENTION

Against the above background, it is an object of the present invention to provide a polarization-influencing optical arrangement, in particular in a microlithographic projection exposure apparatus, via which a setting of the polarization can be realized even for light rays that are not parallel to one another, and also independently of the input polarization direction.

This object is achieved via the features of the independent claims.

According to an aspect of the disclosure, a polarization-influencing optical arrangement, in particular in a microlithographic projection exposure apparatus, comprises
- a first retardation element, which comprises at least one first partial element composed of optically positively uniaxial crystal material and at least one second partial element composed of optically negatively uniaxial crystal material; and
- a second retardation element, which comprises at least one third partial element composed of optically positively uniaxial crystal material and at least one fourth partial element composed of optically negatively uniaxial crystal material;

wherein in at least one configuration of the polarization-influencing optical arrangement the polarization-influencing effect of the first retardation element corresponds to the effect of a first lambda/2 plate having a first fast axis of the birefringence and the polarization-influencing effect of the second retardation element corresponds to the effect of a second lambda/2 plate having a second fast axis of the birefringence, wherein the angle between the first fast axis and the second fast axis is 45°±5°.

Here and hereinafter—in accordance with conventional terminology—an optically positively uniaxial crystal material (also: birefringent material of optically positive character) is understood to mean an optically uniaxial crystal material for which the extraordinary refractive index $n_e$ is greater than the ordinary refractive index $n_o$. Correspondingly, an optically negatively uniaxial crystal material (also: birefringent material of optically negative character) is understood to mean an optically uniaxial crystal material for which the extraordinary refractive index $n_e$ is less than the ordinary refractive index $n_o$.

According to the above aspect the disclosure is based on the concept, in particular, of combining the combination of optically uniaxial crystal materials of opposite optical character (i.e. the combination of optically positively uniaxial and optically negatively uniaxial crystal material) with an orientation of two fast axes of the birefringence at an angle of approximately 45° with respect to one another and, in this way, obtaining an independence of the effect achieved by the polarization-influencing optical arrangement firstly in respect of the angular distribution of the light rays passing through the polarization-influencing optical arrangement, and secondly also in respect of the (input) polarization direction of the light rays impinging on the arrangement.

The present invention makes it possible, in particular, to perform a setting—which is independent of angles of incidence and also independent of the (input) polarization direction of the light rays impinging on the arrangement—of the polarization in a plane of a microlithographic projection exposure apparatus in which the light rays are not all parallel to one another, but rather have an angular distribution. In particular, the polarization can be set independently of angles of incidence in a plane which either does not correspond to a pupil plane or else which constitutes a pupil plane which is arranged downstream of a field generating optical element in the light propagation direction and, consequently, through which the light passes at different angles.

The wording according to which "in at least one configuration of the polarization-influencing optical arrangement" the polarization-influencing effect of the first and of the second retardation element corresponds to the effect of a first and second lambda/2 plate, respectively, with an angle between the fast axes of 45°±5° is intended to express the fact that alongside arrangements with fixed setting of the fast axes which satisfies the angle criterion mentioned, the invention should be deemed also to encompass embodiments in which—as explained in even greater detail below—the relevant fast axes can be set in a variable manner, in which case the angle between the fast axes is not fixedly set, but the angle criterion mentioned can be realized with the use of this variability (in a configuration or setting).

Furthermore, the criterion according to which the angle between the first fast axis and the second fast axis is 45°±5° expresses the fact that certain deviations from the 45° orientation between the corresponding axes are also tolerable or deemed to be encompassed by the invention.

It goes without saying that, here and hereinafter, the terms "first partial element", "second partial element", etc. should in each case be understood such that the order of these partial elements belonging to a respective retardation element in the light propagation direction is arbitrary or interchangeable, that is to say that, for instance, the partial element composed of optically negatively uniaxial crystal material can alternatively be arranged in the light propagation direction upstream or downstream of the partial element composed of optically positively uniaxial crystal material.

In accordance with one embodiment, in at least one of the retardation elements the respective partial elements have mutually perpendicular optical crystal axes. However, the invention is not restricted thereto. In principle, the effect according to the invention of reducing the angular dependence of the retardation can be achieved both in the case of mutually perpendicular orientation of the optical crystal axes on both sides in the partial elements of one and the same retardation element of the polarization-influencing optical arrangement according to the invention and in the case of mutually parallel orientation of the crystal axes.

In the case of the mutually perpendicular orientation of the crystal axes, use is made of the circumstance that the retardation continuously decreases with an increasing tilting angle α (proceeding from a position with normal incidence) of the retardation element in one partial element thereof, whereas it continuously increases with an increasing tilting angle α in the other partial element, such that the compensation effect in the sense of a smaller variation of the retardation depending on the tilting angle of the retardation element is achieved as a result.

In the case of the mutually parallel orientation of the crystal axes, the invention makes use of the circumstance that on account of the different refractive indices of the two crystal materials of optically opposite character, in the case of a tilting of the retardation element, the incident light ray traverses the partial element having a higher average refractive index still with a smaller angle with respect to the perpendicular (that is to say in a position that still "comes closer" to perpendicular passage of light) than the partial element having a lower average refractive index. Consequently, in the case of increasing tilting of the retardation element (or an increasing angle of incidence of the electromagnetic radiation on the polarization-influencing optical arrangement) in the crystal material having a lower average refractive index a greater angle dependence is effectively manifested, which can in turn be used with the aim of the desired compensation effect by the greater retardation being set in the partial element composed of the crystal material having a lower average refractive index in comparison with the crystal material having a higher average refractive index via a suitable choice of the component thicknesses on both sides (that is to say e.g. a retardation having an absolute value of 1*λ in a partial element composed of quartz and a retardation having an absolute value of 1.5*λ in a partial element composed of sapphire for obtaining the total retardation of λ/2). In conjunction with the optically opposite character of the two components, up to a certain component thickness (namely as long as the greater angle dependence in the more weakly refractive crystal material does not overcompensate that in the more highly refractive crystal material), it is thereby likewise possible to achieve a compensation effect in the sense of a smaller variation of the retardation depending on the tilting angle of the retardation element.

Optically positive materials that are particularly suitable according to the invention and are sufficiently transparent for typical operating wavelengths in microlithography of less than 250 nm are, for example, crystalline quartz ($SiO_2$) and magnesium fluoride ($MgF_2$). Optically negative materials that are particularly suitable according to the invention are, for example, sapphire ($Al_2O_3$) and lanthanum fluoride ($LaF_3$).

The invention is not restricted to the realization of operating wavelengths in microlithography of less than 250 nm, but rather can be advantageously realized e.g. in other wavelength ranges as well. A further application also consists, in particular, in a wafer inspection apparatus in which an examination of the wafer for defects can also be effected in a larger wavelength range (e.g. for wavelengths up to approximately 850 nm).

In accordance with one embodiment, in at least one of the retardation elements the respective partial elements are arranged in direct contact with one another. Furthermore, the retardation elements can also be arranged in direct contact with one another. In particular, the partial elements and respectively the retardation elements can be joined to one another optically seamlessly for example via wringing.

In accordance with one embodiment, the polarization-influencing optical arrangement comprises at least one intermediate layer for refractive index matching between successive partial elements, as a result of which the transmission of the arrangement can be increased. In this case, by way of example, typical antireflective (AR) coatings that are customary in microlithography are suitable as intermediate layer.

In accordance with one embodiment, at least one of the retardation elements comprises a grid-type arrangement of first and second and/or third and fourth partial elements. In this case, in particular, partial elements of the same grid-type arrangement can have mutually different orientations of the optical crystal axis.

The invention furthermore also relates to a polarization-influencing optical arrangement, in particular in a microlithographic projection exposure apparatus, comprising a grid-type arrangement of retardation elements, wherein each retardation element in each case comprises a first partial element composed of optically positively uniaxial crystal material and a second partial element composed of optically negatively uniaxial crystal material. In this way, the effective fast axes of the retardation elements can in each case be set such that a desired polarization distribution is set in the light emerging from the arrangement, which, as also in the above-described aspects of the invention, can be achieved angle-independently (or at least with reduced angle dependence), on account of the combination of optically uniaxial crystal materials having opposite character. In this case, in particular in at least one of the retardation elements the respective partial elements can have mutually perpendicular optical crystal axes.

In accordance with one embodiment, the grid-type arrangement is a cartesian grid-type arrangement.

In accordance with another embodiment, the grid-type arrangement is a non-cartesian grid-type arrangement.

In accordance with one embodiment, in at least one of the retardation elements the respective partial elements are embodied as a double wedge arrangement composed of two wedge elements that are displaceable relative to one another. Consequently, it is possible to set the thickness of the relevant partial elements by relative displacement (effected in the wedge direction) of the associated wedge elements, such that a dynamically variable polarization correction can be realized.

In accordance with one embodiment, in at least one of the retardation elements the respective partial elements are embodied as photoelastic modulators.

The photoelastic modulators (PEM) are optical components which are produced from a material which exhibits stress birefringence in such a way that an excitation of the PEM to effect acoustic oscillations leads to a periodically changing mechanical stress and thus to a temporally varying retardation. Photoelastic modulators (PEM) of this type are known in the prior art e.g. from U.S. Pat. No. 5,886,810 A1 or U.S. Pat. No. 5,744,721 A1 and are produced and sold for use at wavelengths of visible light through to the VUV range (approximately 130 nm) e.g. by Hinds Instruments Inc., Hillsboro, Oreg. (USA). The crystal material of the PEM is caused to effect oscillations typically via an electrical voltage being applied to piezoelectric contacts fitted to the crystal material of the PEM, wherein the pulse frequency of the laser can be tuned to the frequency of the applied electrical voltage e.g. such that a laser pulse impinges on the PEM in each case at the maximum of the retardation.

A configuration of the polarization-influencing optical arrangement according to the invention with photoelastic modulators (PEMs) has the advantage that, via the electrical voltage present at the piezo-contacts of the PEMs, both effectively optically positively uniaxial and effectively optically negatively uniaxial crystal material can be produced in a temporally varying manner, wherein, through suitable "triggering" of the laser light source, laser pulses can be generated in each case for the desired birefringence distribution. As a result, it is possible in this way, as explained in even greater detail below, to combine the described effect according to the invention of a polarization-influencing effect independent of input polarization and angle of the ray passage of the light passing through with the possibility of readjusting the electrical voltage e.g. for the compensation of a wavelength dependence of the birefringence produced by the arrangement.

The invention furthermore relates to a microlithographic projection exposure apparatus, and to a method for the microlithographic production of microstructured components.

Further configurations of the invention can be gathered from the description and from the dependent claims.

The invention is explained in greater detail below on the basis of exemplary embodiments illustrated in the accompanying drawings.

BRIEF DESCRIPTION OF THE DRAWINGS

In the drawings:

FIGS. 1a-1b, 2, 3-4a-4b show schematic illustrations elucidating different embodiments of the invention;

DETAILED DESCRIPTION OF PREFERRED EMBODIMENTS

Figure 5:
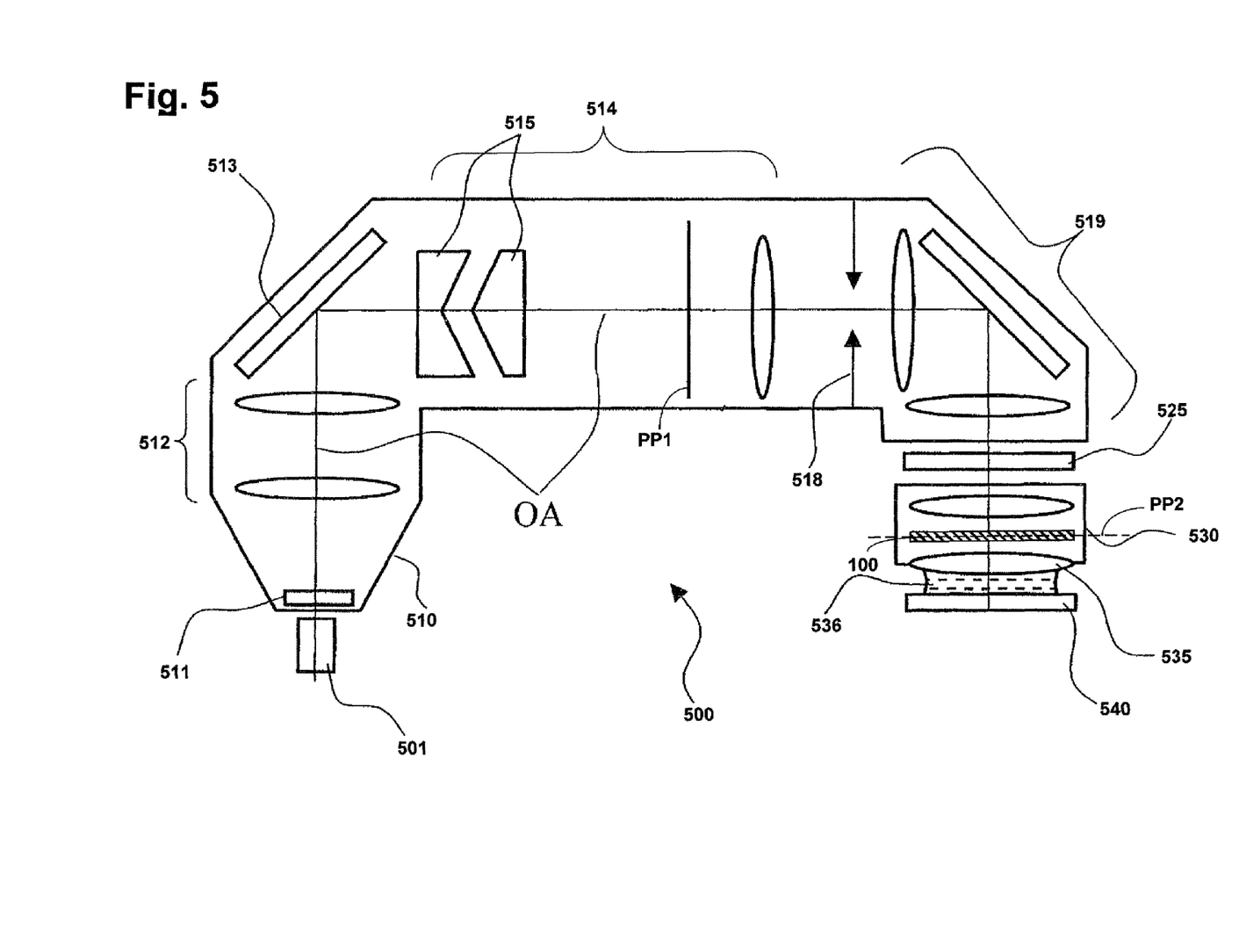
FIG. 5 shows a schematic illustration of the construction of a microlithographic projection exposure apparatus.

FIG. 5 shows in schematic illustration a microlithographic projection exposure apparatus 500 comprising a light source unit 501, an illumination device 510, a mask 525 comprising structures to be imaged, a projection lens 530 and a substrate 540 to be exposed. The light source unit 501 comprises as light source a DUV or VUV laser, for example an ArF laser for 193 nm, an $F_2$ laser for 157 nm, an $Ar_2$ laser for 126 nm or an $Ne_2$ laser for 109 nm, and a ray shaping optical unit that generates a parallel light beam. The rays of the light beam have a linear polarization distribution, when the oscillation planes of the electric field vector of the individual light rays run in a uniform direction.

The parallel light beam impinges on a divergence-increasing optical element 511. By way of example, a diffractive optical element (DOE) can be used as the divergence-increasing optical element 511. This element is followed by a zoom lens 512, which generates a parallel light beam having a variable diameter. The parallel light beam is directed by a deflection mirror 513 onto an optical unit 514 containing an axicon 515. Via the zoom lens 512 in conjunction with the axicon 515, different illumination configurations are produced in a first pupil plane PP1 in the light propagation direction, depending on the zoom setting and position of the axicon elements.

The optical unit 514 is followed by a reticle masking system (REMA) 518, which is imaged by a REMA lens 519 onto the mask (reticle) 525 bearing the structures to be imaged and thereby delimits the illuminated region of the mask 525. The mask 525 is imaged onto the light-sensitive substrate 540 via the projection lens 530. PP2 designates a pupil plane within the projection lens 530. In the example, an immersion liquid 536 having a refractive index different from that of air is situated between a last optical element 535 of the projection lens 530 and the light-sensitive substrate 540.

Different configurations of a polarization-influencing optical arrangement that can be used in the microlithographic projection exposure apparatus 500 in FIG. 5 are described below with reference to FIGS. 1a-1b to 4a-4b and FIGS. 6a-6d to 9a-9c. As indicated in FIG. 5, such a polarization-influencing optical arrangement can be situated for example in the pupil plane PP2 within the projection lens 530. A further possibility for use is, for example, the positioning in a pupil plane (not depicted) within the REMA lens 519. Further advantageous possibilities for use are the positioning in other planes which follow the first pupil plane PP1 of the illumination device 510 in the light propagation direction and in which the light rays are not all parallel to one another, but rather have an angular distribution.

Figure 1A:
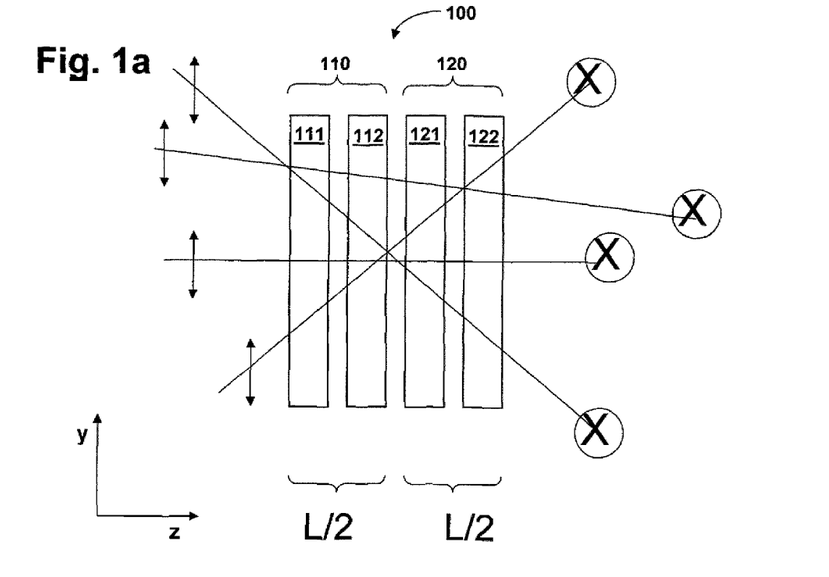
Figure 1B:
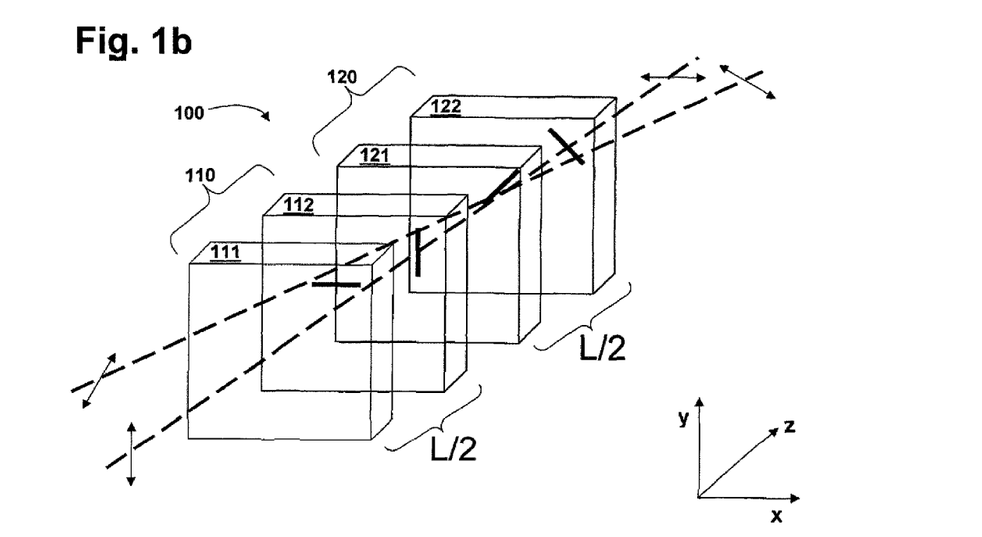

In accordance with FIGS. 1a-1b, a polarization-influencing optical arrangement 100 in a first embodiment of the invention comprises two retardation elements 110 and 120 arranged directly successively in the light propagation direction (=z-direction in the coordinate system depicted), the retardation elements, for their part, respectively being composed of two partial elements 111, 112 and 121, 122, wherein the partial elements are in each case produced from optically uniaxial crystal material and wherein the partial elements 111, 112 and 121, 122 respectively belonging to the same retardation element 110, 120 are of opposite optical character.

Optically positive materials that are particularly suitable according to the invention are, for example, crystalline quartz ($SiO_2$) and magnesium fluoride ($MgF_2$). Suitable optically negative materials are, for example, sapphire ($Al_2O_3$) and lanthanum fluoride ($LaF_3$). With regard to exemplary quantitative indications concerning the partial elements 111, 112 and 121, 122 respectively present in one of the retardation elements, in particular concerning the thicknesses suitable for producing an effect corresponding to a lambda/2 plate, reference is made to DE 10 2007 059 258 A1 (cf. Tables 1 et seq. therein).

In that case, the orientations of the optical crystal axis in the respective partial elements 111, 112 and 121, 122 are chosen such that the polarization-influencing effect of the first retardation element 110 corresponds to the effect of a first lambda/2 plate with a first fast axis of the birefringence and the polarization-influencing effect of the second retardation element 120 corresponds to the effect of a second lambda/2 plate with a second fast axis of the birefringence.

The partial elements 111, 112 and 121, 122, in the same way as the retardation elements 110, 120 formed from them, can be joined to one another in direct contact with one another and optically seamlessly (e.g. via wringing).

One possible configuration of the polarization-influencing optical arrangement 100 with regard to the orientation of the optical crystal axis in the respective partial elements is evident from FIG. 1b. In this case, the respective orientation of the optical crystal axis is represented by the black bars depicted in FIG. 1b, while the double-headed arrows depicted in FIG. 1a symbolize the polarization direction for two light rays passing through the arrangement 100 at different angles upstream and downstream of the polarization-influencing optical arrangement 100. As can be seen from the schematic illustration in FIGS. 1a and 1b, both light rays depicted, despite the different angles of ray passage, in each case experience a rotation of the polarization direction by 90°, which is achieved by virtue of the fact that an angle of 45° is present between the first fast axis of the first retardation element 110 and the second fast axis of the second retardation element 120.

Figure 2:
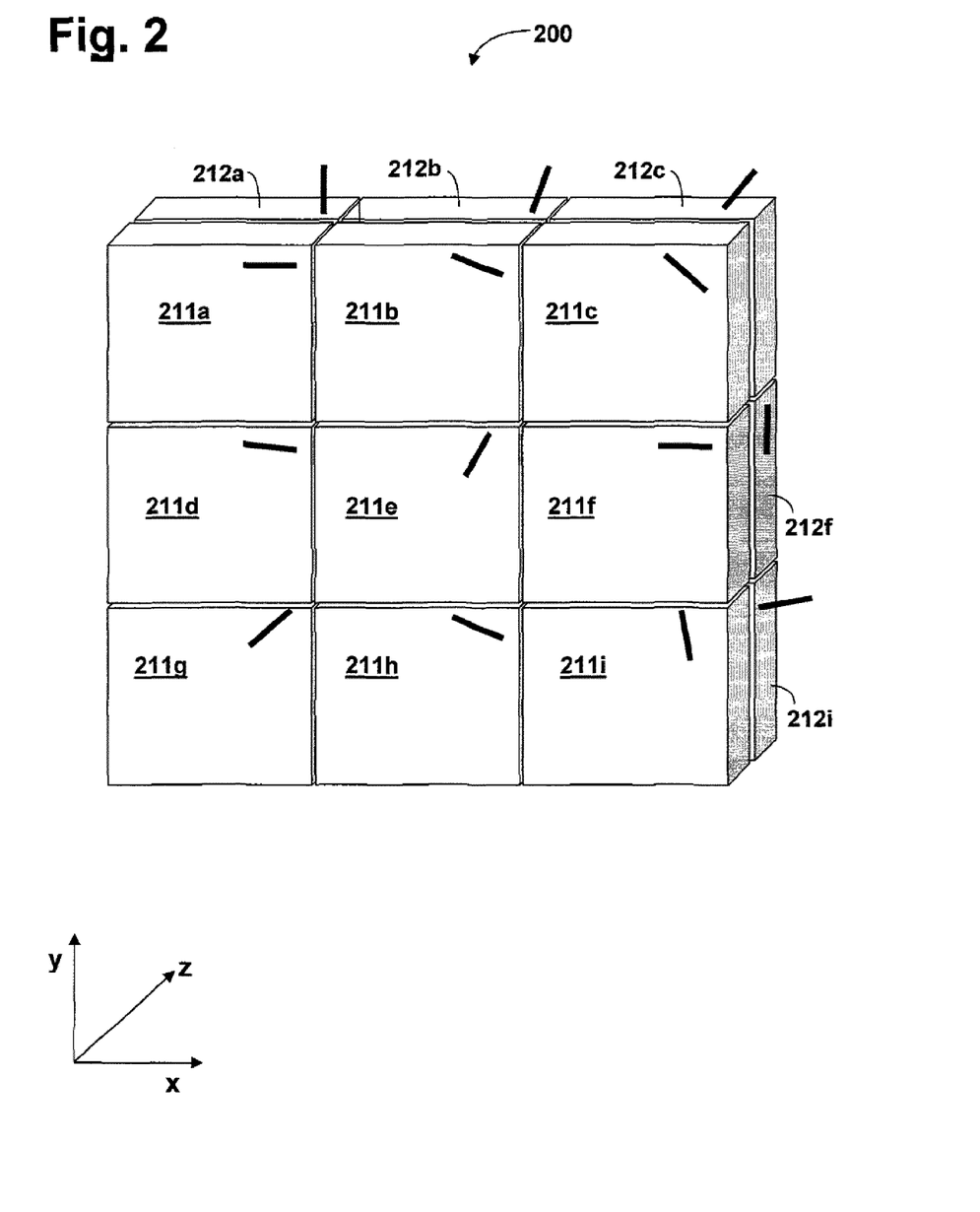

FIG. 2 shows a further embodiment of the invention, wherein a polarization-influencing optical arrangement is embodied as a grid arrangement of retardation elements, wherein each of the retardation elements in each case comprises a first partial element 211a, 211b, 211c, . . . composed of optically positively uniaxial crystal material and a second partial element 212a, 212b, 212c, . . . composed of optically negatively uniaxial crystal material, and wherein the partial elements associated with one and the same retardation element have in each case, as is symbolized once again via the bars depicted in FIG. 2, mutually perpendicular orientations of the optical crystal axis. Consequently, in the exemplary embodiment, each of the retardation elements forms a lambda/2 plate which, in terms of its polarization effect, is independent of the angle of the ray passage of the light passing through. Furthermore, as can likewise be seen from FIG. 2, the first partial elements 211a, 211b, 211c, . . . among one another and also the second partial elements 212a, 212b, 212c, . . . among one another have at least in part different orientations of the respective optical crystal axes.

On account of the different orientations of the first partial elements 211a, 211b, 211c, . . . among one another and of the second partial elements 212a, 212b, 212c, . . . among one another, the resulting fast axes of the birefringence of the corresponding retardation elements also differ from one another, such that in the individual plots or channels formed in each case by the retardation elements, the polarization direction of the linearly polarized light passing through is rotated with different polarization rotation angles (wherein the output polarization direction in each case results from the mirroring of the input polarization direction at the effective fast axis of the birefringence of the respective retardation element). Such an arrangement can be used for producing a desired polarized illumination setting, i.e. a desired intensity and polarization distribution (wherein the intensity distribution can be set for instance via a suitable diffractive optical element as shown in FIG. 5), wherein in particular (but without the invention being restricted thereto) a constantly linear input polarization distribution can be converted into a quasi-tangential or quasi-radial output polarization distribution.

In further embodiments, the individual retardation elements of the grid arrangement from FIG. 2 can also be designed for a retardation that is different from the value lambda/2 (e.g. with a retardation of 10 nm), in order thus to compensate for e.g. an undesired birefringence occurring within the optical system or undesired retardation resulting therefrom ("system retardation"). As in the case of the previous embodiments, such a configuration is also distinguished by the fact that the effect achieved (that is to say in the example e.g. the retardation of 10 nm produced) is independent of the angle of the ray passage of the light passing through.

This angle independence has the consequence that the polarization-influencing optical arrangement according to the invention can also be used e.g. in a pupil plane in which (e.g. on account of a field generating element through which the light already passes upstream) light passes through at different angles (for example in the pupil plane of the REMA lens of the illumination device or in the pupil plane PP2 of the projection lens, in each of which the previously generated field is present in the form of an angular distribution), in order to carry out a pupil-dependent polarization correction. In other words, the use of the polarization-influencing optical arrangement according to the invention for instance in the projection exposure apparatus 500 from FIG. 5 is not restricted to the first pupil plane PP1 of the illumination device 510, since in other planes as well (such as, for instance, the further pupil planes mentioned above) a polarization correction can be carried out without undesired dependences on the angle of ray passage.

The polarization-influencing optical arrangement can furthermore also be used in a field plane in order to correct a retardation distribution in the field plane independently of the distribution in the pupil plane (or without influencing the latter) or in order to manipulate the polarization distribution across the field plane or to perform a rotation of the polarization direction.

Furthermore, the polarization-influencing optical arrangement can also be used between a field plane and pupil plane (if e.g. only a rotation of the polarization direction by an angle of 90° is desired). In principle, the polarization-influencing optical arrangement according to the invention can be arranged at an arbitrary position in the illumination device or in the projection lens, wherein the angles of incidence of the light rays impinging on the polarization-influencing optical arrangement are preferably not greater than 40°.

Figure 3:
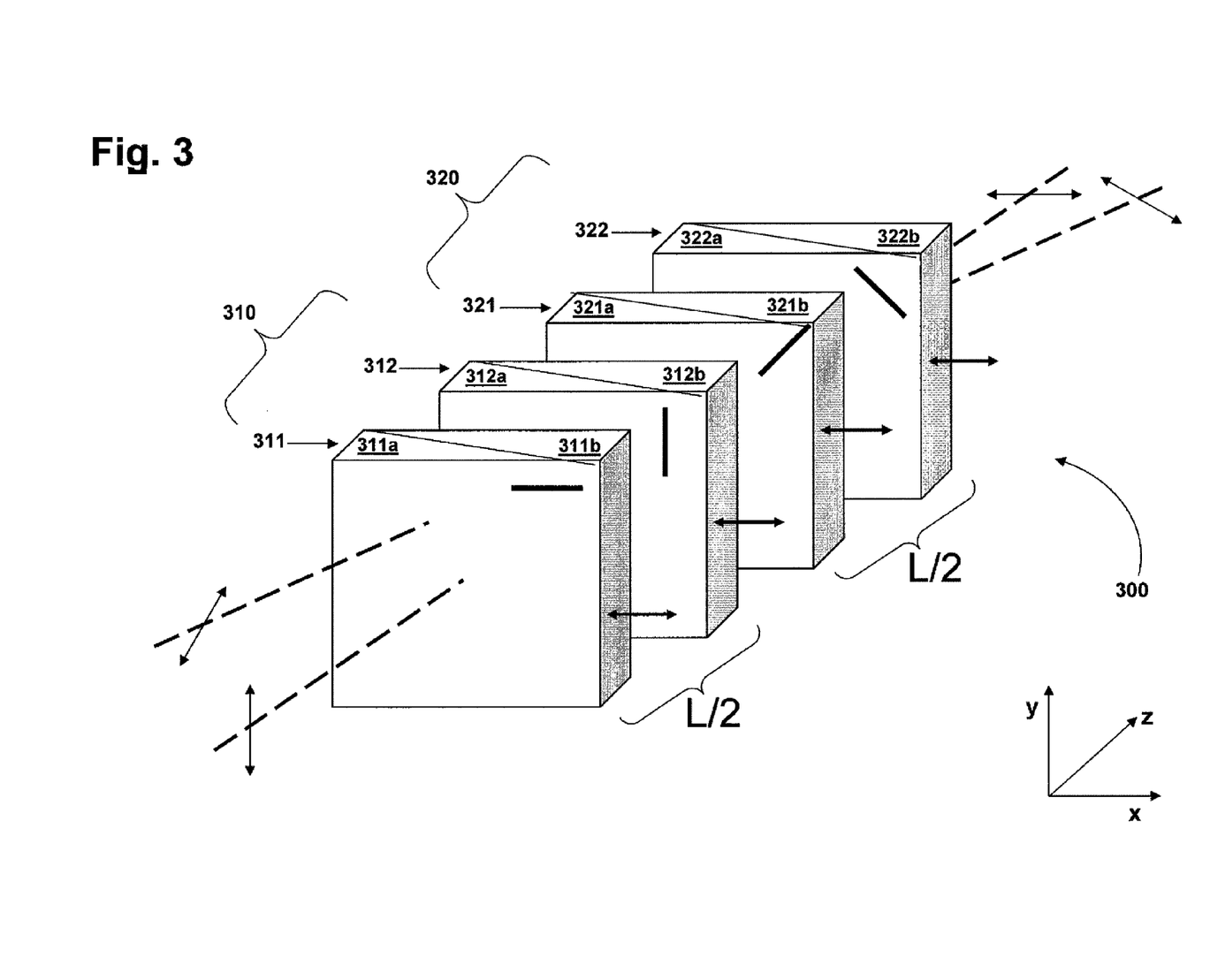

FIG. 3 shows a further embodiment of the invention in the form of a polarization-influencing optical arrangement 300, which differs from the arrangement 100 from FIGS. 1a-1b in that in the retardation elements 310 and 320 the respective partial elements 311, 312 and 321, 322 (for the materials of which the explanations concerning FIGS. 1a-1b are moreover analogously applicable) are embodied as double wedge arrangements composed of two wedge elements 311a, 311b, 312a, 312b, 321a, 321b, 322a and 322b that are displaceable relative to one another. Consequently, the thickness of the partial elements 311, 312, 321 and 322 can be set by relative displacement of the associated wedge elements 311a, 311b, 312a, 312b, 321a, 321b, 322a and 322b that is effected in the x-direction, in order in this way once again to be able to perform a dynamically variable polarization correction. In this case, e.g. in the initial configuration shown in FIG. 3, the polarization-influencing effect of each of the retardation elements 310, 320 can correspond to the effect of a lambda/2 plate, wherein this polarization-influencing effect can then be varied by relative displacement of the associated wedge elements that is effected in the x-direction.

A switchability or dynamic settability of the polarization effect provided can thus be achieved as a result. The dynamic variability of the polarization-influencing effect provided in the exemplary embodiment from FIG. 3 furthermore also makes it possible to take account of or compensate for a wavelength dependence of the birefringence produced by the arrangement 300 via displacing the wedge elements 311a, 311b, 312a, 312b, 321a, 321b, 322a and 322b relative to one another in a suitable manner in the x-direction in order to manipulate the effective thickness.

In particular, proceeding from the configuration (illustrated in FIG. 3) of the polarization-influencing optical arrangement 300 as a 90° rotator (the effect of which, in accordance with the embodiments described above, is independent of the light passage angle and of the input polarization direction)—this function as a 90° rotator can also be maintained in a wavelength-independent manner by suitable displacement of the wedge elements.

Figure 4A:
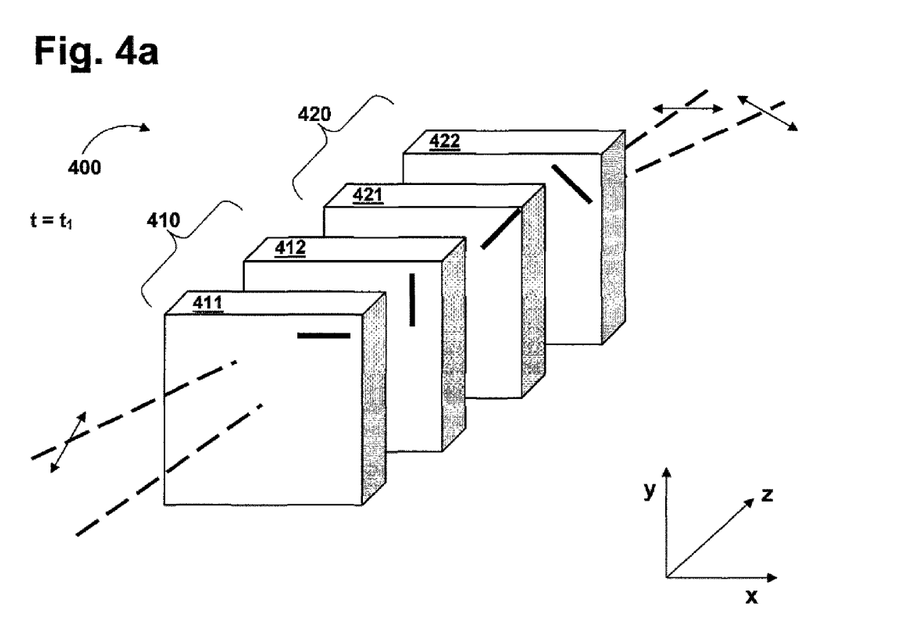
Figure 4B:
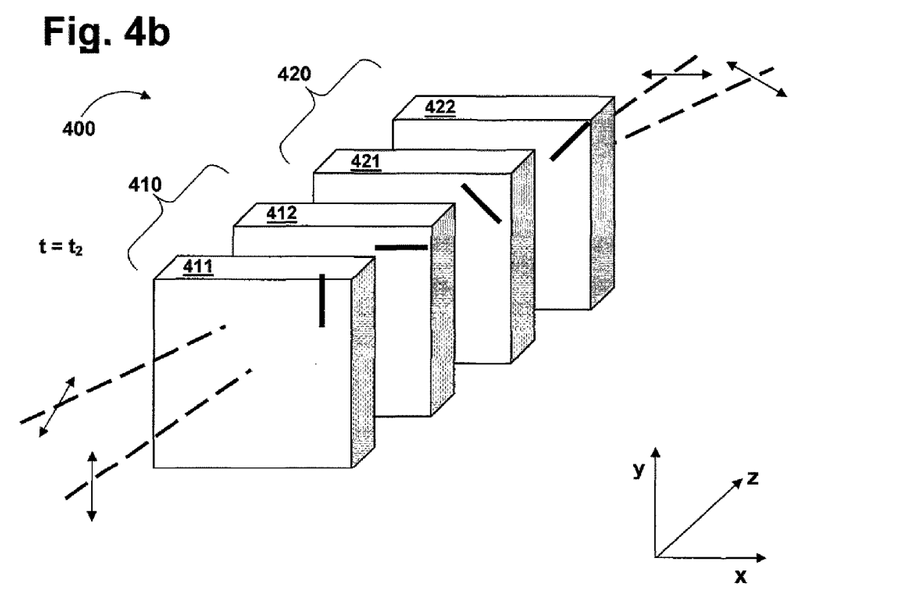

FIGS. 4a-4b shows a further embodiment of the invention in the form of a polarization-influencing optical arrangement 400, which differs from the arrangement 100 from FIGS. 1a-1b in that in the retardation elements 410 and 420 the respective partial elements 411, 412 and 421, 422 are configured as photoelastic modulators (PEMs).

Via the electrical voltage present at the piezo-contacts (not illustrated) of the PEMs, both effectively optically positively uniaxial and effectively optically negatively uniaxial crystal material can now be produced in a temporally varying manner, such that each of the partial elements 411, 412 and 421, 422 exhibits optically positively uniaxial and optically negatively uniaxial behavior alternately or in an oscillating manner via the electrical voltage periodically present. If the PEMs associated with one and the same retardation element 410 or 420, respectively, are operated with a phase shift of 180° relative to one another, a polarization-influencing optical arrangement which is effective in accordance with the embodiments described above can thus be realized which, in terms of its polarization-influencing effect, is independent both of the input polarization and of the angle of the ray passage of the light passing through.

By way of example, in accordance with FIG. 4a, at an instant $t=t_1$ the first partial element 411 can form an optically positively uniaxial crystal, while the second partial element 412 constitutes an optically negatively uniaxial crystal at the same instant. At a later instant $t=t_2$, the conditions are exactly reversed, etc. Suitable "triggering" of the laser light source can achieve the effect that laser pulses are generated in each case for the desired birefringence distribution.

As a result it is thus possible once again to achieve a switchability or dynamic settability of the polarization effect provided for the purpose of adaptation or variation of the birefringence in the optical system. In this case, analogously to the embodiment from FIG. 3, a wavelength dependence of the birefringence produced by the arrangement 400 can be taken into account or compensated for by corresponding readjustment of the electrical voltage. In particular, proceeding once again from a configuration of the polarization-influencing optical arrangement 400 as a 90° rotator (the effect of which, in accordance with the embodiments described above, is independent of the light passage angle and of the input polarization direction)—this function can be maintained in a wavelength-independent manner by suitable readjustment of the electrical voltage.

In the following, further embodiments of the present invention are described with reference to FIGS. 6a-6d-8. According to a further aspect of the present disclosure described with reference to FIGS. 6a-6d-8, an arrangement of retardation elements according to the invention can also be used in order to efficiently compensate for non-desired retardation effects, which can in particular be caused by intrinsic birefringence (being present e.g. in optical components such as lenses made from cubic crystalline materials such as calcium fluoride, $CaF_2$).

Figure 9:
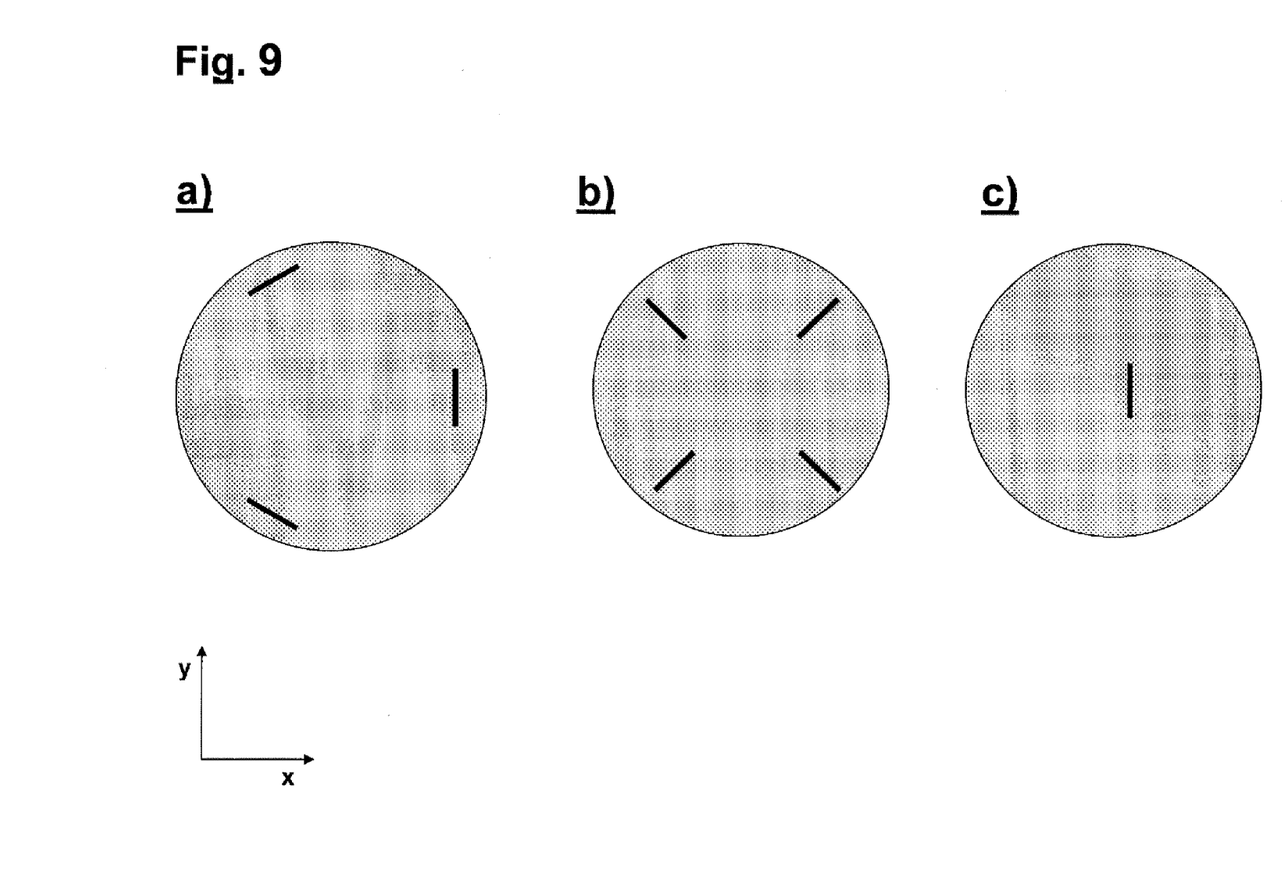
FIG. 9a-c show schematic illustrations of typical retardation distributions caused by intrinsic birefringent lenses for different crystal cuts.

FIG. 9a-c show schematical illustrations of typical retardation distributions that are caused by intrinsic birefringence in calcium fluoride lenses having a [111]-crystal cut (FIG. 9a), [100]-crystal cut (FIG. 9b) or [110]-crystal cut (FIG. 9c). Whereas for the [111]-crystal cut a three-fold azimuthal symmetry of the birefringence distribution is obtained according to FIG. 9a, the birefringence distribution for the [100]-crystal cut has a four-fold azimuthal symmetry. The illustrations of FIG. 9a-c are strongly simplified in such that regions, for which the fast axis of the intrinsic birefringence is shown, have maxima in the absolute value of birefringence, whereas in the remaining other regions the absolute value of the intrinsic birefringence is relatively low.

Figure 6:
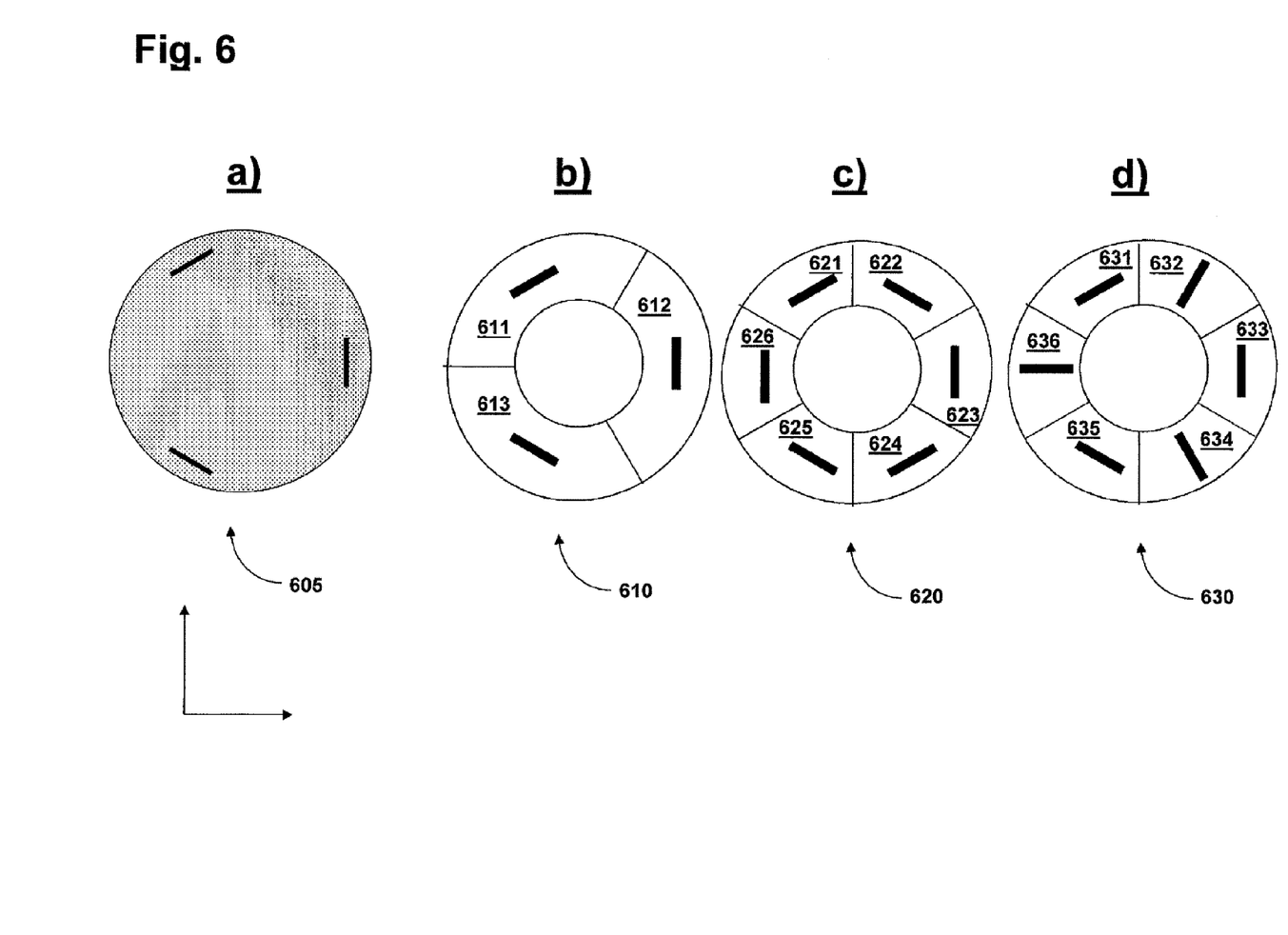
FIGS. 6a-6d, 7-8 show schematic illustrations elucidating further embodiments of the invention.

FIGS. 6a-6d shows now, in the exemplarily context of the birefringence distribution of a calcium fluoride lens having a [111]-crystal cut (see FIG. 6a), schematic illustrations of polarization-influencing optical arrangements 610, 620 and 630 (FIG. 6b-d). As explained in the following with reference to FIGS. 6a-6d-8 (for the example of [111]-$CaF_2$-lenses), polarization-influencing optical arrangements such as those shown in FIG. 6b-d can be used to efficiently compensate for undesired retardation effects caused by the afore described intrinsic birefringence. The polarization-influencing optical arrangements described with reference to FIGS. 6a-6d to FIG. 8 are preferably based in a pupil plane of the optical system.

Each of the embodiments of a polarization-influencing optical arrangement shown in FIG. 6b-d represents a grid-type arrangement of retardation elements 611-613, 621-626 or 631-636, respectively, wherein each of the retardation elements comprises, analogously to the embodiment of FIG. 2, a first partial element composed of optically positively uniaxial crystal material and a second partial element composed of optically negatively uniaxial crystal material. As a consequence, as has been already described before, an independence of the effect achieved by the polarization-influencing optical arrangement in respect of the angular distribution of the light rays passing through the polarization-influencing optical arrangement is obtained. Further, the polarization-influencing optical arrangements shown in FIG. 6b-d comprise retardation elements 611-613, 621-626 or 631-636 each being formed by only two partial elements (analogously to FIG. 2, but in contrast to FIGS. 1a-1b). In that respect the embodiments of FIG. 6b-d also involve the concept to reduce the number of partial elements (i.e. of optical components needed) by forming a grid-type arrangement in which a variation of the input polarization over the cross-section of the light beam can be considered by a variation of the direction of the resulting effective fast axis in the respective retardation elements of the grid-type arrangement.

Further, for each retardation element formed by two partial elements arranged in succession along the light propagation direction analogously to FIG. 2 in the respective polarization-influencing optical arrangement shown in FIG. 6b-d, only the orientation of the resulting effective fast axis of birefringence is shown in FIG. 6b-d. As to the absolute value of birefringence achieved, each of the retardation elements 611-613, 621-626 or 631-636 forms a lambda/2 plate (which, in terms of its polarization effect, is independent of the angle of the ray passage of the light passing through as already mentioned above).

As can also be seen in FIG. 6b-d, the respective retardation elements 611-613, 621-626 or 631-636, respectively, are forming a segmented arrangement which can also be regarded as a non-cartesian grid-type arrangement of retardation elements. More specifically, the orientations of the resulting effective fast axes of the retardation elements 611-613, 621-626 or 631-636, respectively, are—at least in good approximation—either parallel or perpendicular to the respective fast axis of the intrinsic birefringence distribution of a [111]-calcium fluoride lens according to FIG. 6a.

Of course, other embodiments of polarization-influencing optical arrangements are possible which are analogously adapted to intrinsic birefringent distributions of a calcium fluoride lens having a [100]-crystal cut or a [110]-crystal cut of a calcium fluoride lens (see FIG. 9b or 9c, respectively). Furthermore, the disclosure is not limited to intrinsic birefringent lenses made of calcium fluoride, but also applicable to other intrinsic birefringent materials having a cubic crystal structure.

Figure 7:
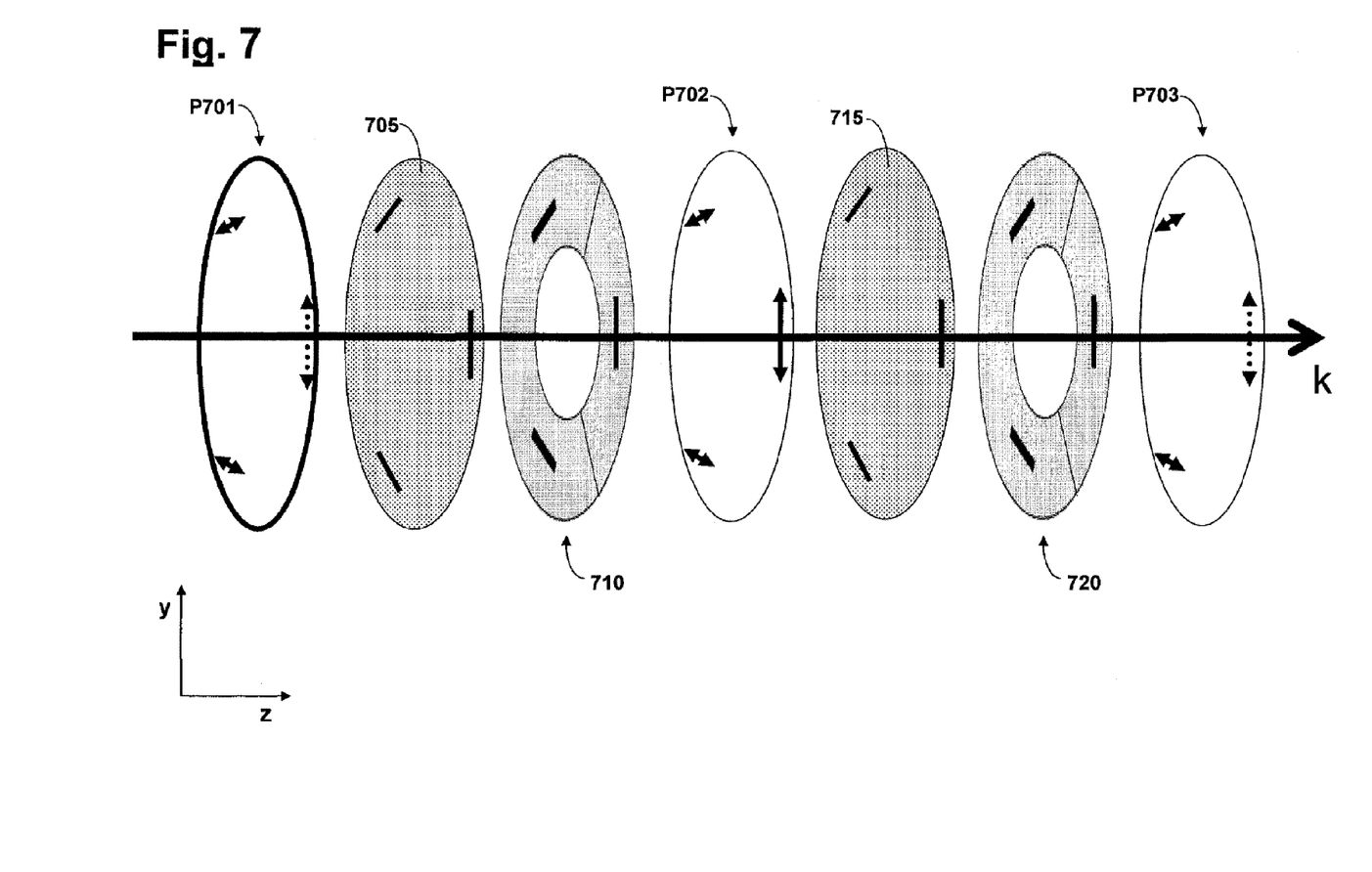
Figure 8:
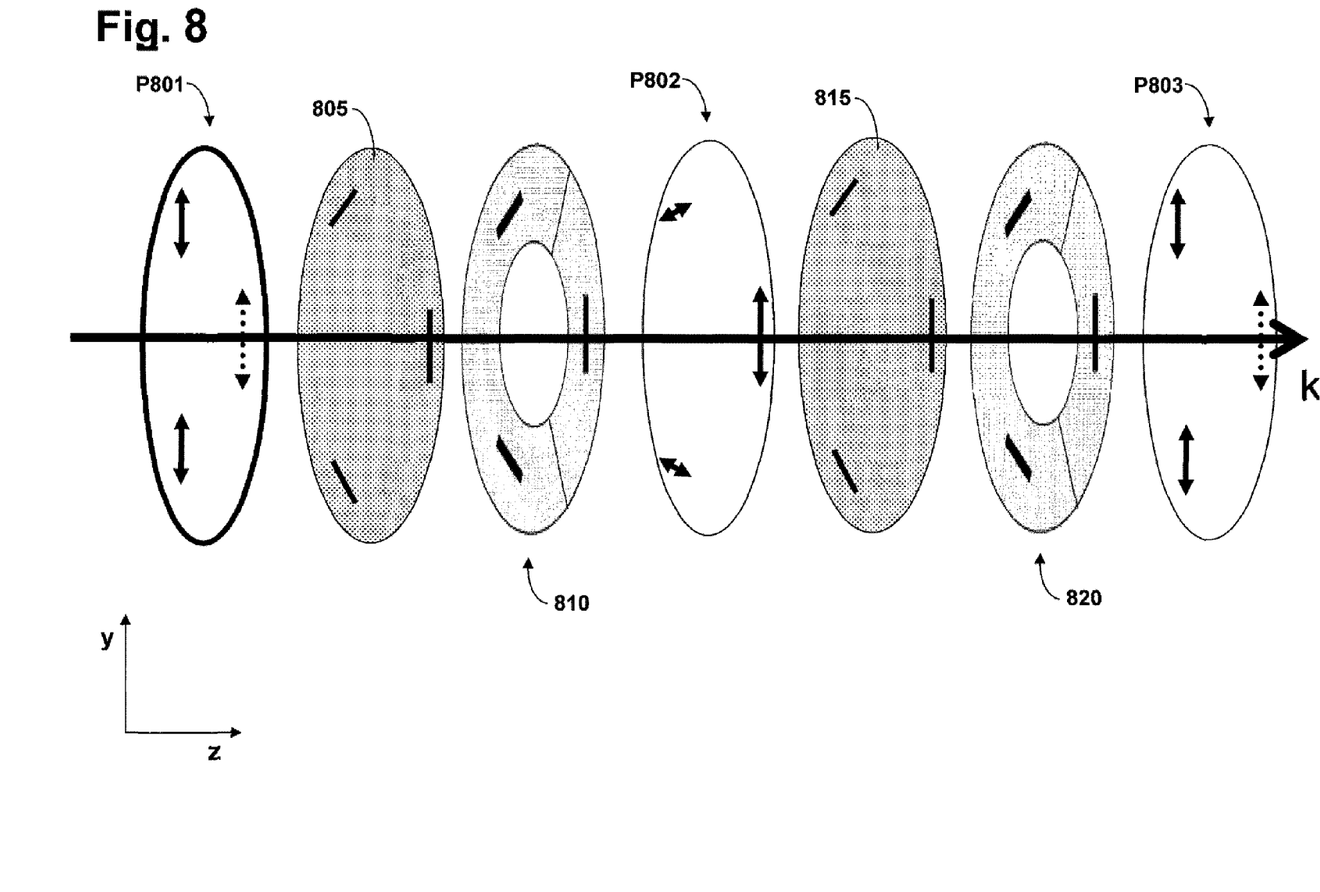

FIG. 7 and FIG. 8 each show an arrangement of optical elements, in which two intrinsic birefringent $CaF_2$-lenses having a [111]-crystal cut are present. The corresponding intrinsic birefringent distributions for these $CaF_2$-lenses are schematically illustrated analogously to FIG. 6a and designated in FIG. 7, 8 as "705", "715" or "805", "815", respectively. As explained in the following, a compensation of the retardation effects of the intrinsic birefringent lenses is achieved in the arrangements of FIG. 7 and FIG. 8 by two identical polarization-influencing optical arrangements 710, 720 or 810, 820, respectively. The embodiments of FIG. 7 and FIG. 8 only differ in the respective input polarization distribution of the light incident on the whole arrangement (or the first intrinsic birefringent $CaF_2$-lens), respectively.

According to FIG. 7, the input polarization distribution P701 being incident on the first intrinsic birefringent $CaF_2$-lens is a tangential polarization distribution. As can be seen from the schematic illustrations of the effective fast axes of birefringence in the polarization-influencing optical arrangement 710, 720, those fast axes are parallel to the respective fast axis of the maxima in the intrinsic birefringence distributions 705 or 715, respectively, having the effect that the polarization distribution of the light passing through the whole arrangement of optical components remains substantially unchanged. This effect is based on the concept disclosed in US 2005/0243222 A1, according to which perturbations of the polarization distribution of a light beam in a birefringent material are avoided if the polarization direction is aligned either parallel or perpendicular to the fast (or slow) axis of birefringence, i.e. the respective polarization state corresponds to an eigenstate of the intrinsic birefringence.

In FIG. 8, the input polarization distribution P801 being incident on the first intrinsic birefringent $CaF_2$-lens is a constant linear polarization distribution (with the direction of linear polarization being parallel to the y-direction). As a consequence, the polarization distribution is in regions (particularly for the upper left and lower left region in the polarization distribution P801) not parallel to the respective orientation of the fast axis in the intrinsic birefringence distribution 805 of the first intrinsic birefringent $CaF_2$-lens. Consequently, the polarization state is modified in those regions by the intrinsic birefringence (resulting in an elliptical polarization state in the respective regions) before the light is incident on the first polarization-influencing optical arrangement 810.

Since each of the retardation elements of the polarization-influencing optical arrangements 810 or 820, respectively, has a resulting polarization-influencing effect corresponding to the effect of a lambda/2-plate as already mentioned above, the polarization is mirrored or flipped at the respective resulting fast axis of the respective retardation element of arrangement 810 and thereby rotated, leading to a polarization distribution P802 which is incident on the second intrinsic birefringent lens (with intrinsic birefringence distribution 815).

The region-wise rotation of polarization effected by the arrangement 810 results in the fact that any retardation that is "collected" downstream of the arrangement 810 at least partially compensates for the retardation collected upstream of the arrangement 810, making use of the concept already known from US 2005/0094268 A1. As pointed out in US 2005/0094268 A1 in more detail for the example of a 90° rotator, this compensation concept is based on the fact that due to the 90°-rotation of polarization the states of polarization lying in the respective plane of incidence of the light ray or perpendicular thereto are in effect exchanged upstream and downstream of an 90°-rotator, so that any retardation collected downstream of the 90°-rotator will at least partially compensate for the retardation collected upstream of the 90°-rotator. When referring again to FIG. 8, this concept can be fully used for a 45°-orientation of the fast axis of birefringence in the respective retardation elements of arrangement 810 (corresponding to the effect of a 90°-rotator) or partially for a rotation of polarization by an angle different from 90°.

As schematically shown in FIG. 8, this compensation of intrinsic birefringence ultimately results in the fact that, downstream of the second polarization-influencing optical arrangement 820, the final output polarization distribution P803 corresponds to the original input polarization distribution P801 (with the undesired retardation effects due to the intrinsic birefringent lenses and the accompanying ellipticity of the polarization state being compensated).

Although in the afore described embodiments of FIG. 7 and FIG. 8, two polarization-influencing optical arrangements 710, 720 or 810, 820, respectively, have been used, the disclosure is not limited thereto. In other embodiments, it is also possible to use only one polarization-influencing optical arrangement (which can be placed at an appropriate position in the optical system and in particular between at least two birefringent lenses analogously to FIG. 7 or FIG. 8. In this case, in order to finally achieve a desired output polarization, the input polarization (e.g. being incident on the first intrinsic birefringent lens) is selected different from the desired output polarization in such a way that the desired output polarization is achieved only as a result of the polarization-influencing optical arrangement.

In further embodiments, the polarization-influencing optical arrangement(s) as described before with reference to FIGS. 6a-6d to FIG. 8 can also be configured such that they can be retracted from the optical path via-an appropriate retractor.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical arrangement, comprising:
   a first retardation element comprising a first partial element comprising an optically positively uniaxial crystal material, and a second partial element comprising an optically negatively uniaxial crystal material; and
   a second retardation element comprising a third partial element comprising an optically positively uniaxial crystal material, and a fourth partial element comprising an optically negatively uniaxial crystal material,
   wherein:
   the optical arrangement is configurable so that a polarization-influencing effect of the first retardation element corresponds to an effect of a first lambda/2 plate having a first fast axis of the birefringence and a polarization-influencing effect of the second retardation element corresponds to an effect of a second lambda/2 plate having a second fast axis of the birefringence;
   an angle between the first fast axis and the second fast axis is 45°±5°; and
   the optical arrangement is a microlithographic optical arrangement.

2. The optical arrangement of claim 1, wherein the first and second partial elements have mutually perpendicular optical crystal axes.

3. The optical arrangement of claim 1, wherein the first and second partial elements directly contact each other.

4. The optical arrangement of claim 1, wherein the first and second retardation elements directly contact each other.

5. The optical arrangement of claim 1, wherein the optically positively uniaxial crystal material is selected from the group containing crystalline quartz and magnesium fluoride.

6. The optical arrangement of claim 1, wherein the optically negatively uniaxial crystal material is selected from the group containing sapphire and lanthanum fluoride.

7. The optical arrangement of claim 1, further comprising a layer between successive partial elements, the layer being configured to match refractive indices of the successive partial elements.

8. The optical arrangement of claim 1, wherein the first retardation element comprises a grid comprising the first and second partial elements.

9. The optical arrangement of claim 1, wherein the first and second partial elements define an arrangement comprising two wedge elements that are displaceable relative each other.

10. The optical arrangement of claim 1, wherein the first and second partial elements comprise photoelastic modulators.

11. An apparatus, comprising:
    an illumination device configured to illuminate an object in an object plane; and
    a projection lens configured to image the object onto an image plane,
    wherein the apparatus comprises an optical arrangement according to claim 1, and the apparatus is a microlithographic projection exposure apparatus.

12. The apparatus of claim 11, wherein the retardation elements are arranged directly successively along an optical axis of the apparatus.

13. The apparatus of claim 11, wherein the optical arrangement is arranged outside a pupil plane of the apparatus.

14. The apparatus of claim 11, wherein the optical arrangement is arranged in a pupil plane of the projection exposure apparatus, and the pupil plane follows a first pupil plane in a direction that light propagates through the apparatus during use of the apparatus.

15. An apparatus, comprising:
an optical arrangement according to claim 1, wherein the apparatus is a wafer inspection apparatus.

16. A method of using a microlithographic projection exposure apparatus comprising an illumination device and a projection objective, the method comprising:
using the illumination device to illuminate an object in an object plane; and
using the projection objective to image the object onto an image plane,
wherein the microlithgraphic projection exposure apparatus comprises the optical arrangement of claim 1.

17. An optical arrangement, comprising:
a plurality of retardation elements, each retardation element comprising:
a first partial element comprising an optically positively uniaxial crystal material; and
a second partial element comprising an optically negatively uniaxial crystal material,
wherein:
the first partial elements define a first grid of partial elements;
the second partial elements define a second grid of partial elements;
the second grid of partial elements is disposed behind the first grid of partial elements; and
the optical arrangement is a microlithographic optical arrangement.

18. The optical arrangement of claim 17, wherein, in at least one of the retardation elements, the first and second partial elements have mutually perpendicular optical crystal axes.

19. The optical arrangement of claim 17, wherein, for each first partial element, the first partial element has an at least partially different orientation of its optical crystal axis relative to the optical crystal axis of at least one other first partial element.

20. The optical arrangement of claim 17, wherein the first grid of partial elements is a Cartesian grid.

21. The optical arrangement of claim 17, wherein the first grid of partial elements is a non-cartesian grid.

22. The optical arrangement of claim 17, wherein, for each second partial element, the second partial element has an at least partially different orientation of its optical crystal axis relative to the optical crystal axis of at least one other second partial element.

* * * * *